(12) United States Patent
Kwon et al.

(10) Patent No.: US 7,536,658 B2
(45) Date of Patent: May 19, 2009

(54) POWER PAD SYNTHESIZER FOR AN INTEGRATED CIRCUIT DESIGN

(75) Inventors: Sung-Hoon Kwon, Sunnyvale, CA (US); Philip Hui-Yuh Tai, Cupertino, CA (US); Yi-Min Jiang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 344 days.

(21) Appl. No.: 10/976,719

(22) Filed: Oct. 29, 2004

(65) Prior Publication Data

US 2006/0095881 A1 May 4, 2006

(51) Int. Cl.
*G06F 17/50* (2006.01)

(52) U.S. Cl. .................. 716/1; 716/8; 716/9; 716/18

(58) Field of Classification Search .................. 716/10, 716/1, 8, 9, 18
See application file for complete search history.

(56) References Cited

U.S. PATENT DOCUMENTS

| | | | | |
|---|---|---|---|---|
| 4,726,991 | A | 2/1988 | Hyatt et al. | 428/329 |
| 4,811,237 | A | 3/1989 | Putatunda et al. | 364/491 |
| 5,498,767 | A * | 3/1996 | Huddleston et al. | 716/12 |
| 5,598,348 | A | 1/1997 | Rusu et al. | 364/491 |
| 5,808,900 | A | 9/1998 | Buer et al. | 716/10 |
| 5,933,358 | A | 8/1999 | Koh et al. | 704/14 |
| 5,962,926 | A * | 10/1999 | Torres et al. | 257/786 |
| 6,043,672 | A * | 3/2000 | Sugasawara | 324/765 |
| 6,202,191 | B1 | 3/2001 | Filippi et al. | 716/5 |
| 6,202,196 | B1 | 3/2001 | Huang et al. | 716/14 |
| 6,308,307 | B1 | 10/2001 | Cano et al. | 716/8 |
| 6,311,147 | B1 | 10/2001 | Tuan et al. | 703/18 |
| 6,405,357 | B1 | 6/2002 | Chao et al. | 716/10 |
| 6,446,245 | B1 | 9/2002 | Xing et al. | 716/10 |
| 6,457,157 | B1 * | 9/2002 | Singh et al. | 716/2 |
| 6,487,706 | B1 | 11/2002 | Barkley et al. | 716/7 |
| 6,510,539 | B1 | 1/2003 | Deemie et al. | |
| 6,523,154 | B2 | 2/2003 | Cohn et al. | 716/6 |

(Continued)

OTHER PUBLICATIONS

M. Zhao et al., Optimal Placement of Power Supply Pads and Pins, (DAC), pp. 165-170, 2004.

(Continued)

*Primary Examiner*—Jack Chiang
*Assistant Examiner*—Suchin Parihar
(74) *Attorney, Agent, or Firm*—Silicon Valley Patent Group LLP; Omkar Suryadevara

(57) ABSTRACT

A power pad synthesizer automatically proposes locations of pads that are to carry power in an integrated circuit design. Specifically, a computer is programmed to prepare the plan in at least two stages as follows. In a first stage, a number of pads are proposed around a periphery of the IC design such that an attribute (e.g. maximum voltage drop) satisfies a predetermined condition (e.g. below a user-specified limit that's scaled up by a predetermined amount). In a second stage, the computer automatically identifies a specific location in the design for having an attribute value that satisfies another predetermined condition (e.g. interior location of maximum voltage drop or peripheral location of maximum current), and automatically proposes one or more additional pads at one or more peripheral locations that are identified by a predetermined rule based on the identified specific location (e.g. having the same x-coordinate or the same y-coordinate).

18 Claims, 10 Drawing Sheets

U.S. PATENT DOCUMENTS

| | | | |
|---|---|---|---|
| 6,598,206 | B2 | 7/2003 | Darden et al. |
| 6,675,139 | B1 | 1/2004 | Jetton et al. .................... 703/17 |
| 6,981,230 | B1 | 12/2005 | Lin et al. ........................ 716/1 |
| 6,991,961 | B2* | 1/2006 | Hubbard et al. ............. 438/106 |
| 7,043,389 | B2* | 5/2006 | Plusquellic ................. 702/117 |
| 7,091,755 | B1* | 8/2006 | Zhou et al. ................... 327/108 |
| 7,111,265 | B1* | 9/2006 | Tan et al. ...................... 716/10 |
| 2001/0039642 | A1* | 11/2001 | Anzai .......................... 716/10 |
| 2002/0013931 | A1 | 1/2002 | Cano et al. ..................... 716/1 |
| 2002/0170020 | A1 | 11/2002 | Darden et al. |
| 2003/0014201 | A1* | 1/2003 | Schultz ........................ 702/64 |
| 2003/0140327 | A1 | 7/2003 | Lai et al. ...................... 716/12 |
| 2003/0151047 | A1* | 8/2003 | Corbett et al. ................ 257/48 |
| 2003/0237059 | A1* | 12/2003 | Schultz ......................... 716/4 |
| 2004/0087157 | A1* | 5/2004 | Wong ......................... 438/689 |
| 2004/0088443 | A1* | 5/2004 | Tran et al. ..................... 710/1 |
| 2004/0163054 | A1* | 8/2004 | Frank et al. .................... 716/4 |
| 2004/0268281 | A1* | 12/2004 | Dotson et al. ................ 716/10 |
| 2005/0050502 | A1* | 3/2005 | Kurihara et al. .............. 716/10 |
| 2005/0077634 | A1* | 4/2005 | Seaman et al. ............... 257/786 |
| 2005/0090916 | A1* | 4/2005 | Aghababazadeh et al. .... 700/90 |
| 2005/0091629 | A1* | 4/2005 | Eisenstadt et al. ............ 716/13 |
| 2005/0236177 | A1* | 10/2005 | Inagaki et al. ............... 174/255 |
| 2006/0006384 | A1* | 1/2006 | Eldridge et al. .............. 257/48 |
| 2006/0080630 | A1 | 4/2006 | Lin .............................. 716/11 |
| 2006/0095870 | A1* | 5/2006 | Tai et al. ........................ 716/1 |
| 2006/0095872 | A1 | 5/2006 | McElvain et al. .............. 716/1 |
| 2006/0239102 | A1* | 10/2006 | Saita et al. .................. 365/226 |
| 2008/0052649 | A1* | 2/2008 | Tai et al. ........................ 716/5 |
| 2008/0066026 | A1* | 3/2008 | Tai et al. ........................ 716/4 |

OTHER PUBLICATIONS

J. Oh et al., "Multi-pad Power/Ground Network Design for Uniform Distribution of Ground Bounce", (DAC), pp. 287-290, 1998.

H. H. Chen et al., "Power Supply Noise Analysis Methodology for Deep-Submicron VLSI Chip Design", (DAC), pp. 1-6, 1997.

S. R. Nassif et al., "Fast Power Grid Simulation", (DAC), pp. 1-6, 2000.

H. Su et al., "Analysis and Optimization of Structured Power/Ground Networks", Department of Electrical and Computer Engineering University of Minnesota, pp. 1-33, (date believed to be prior to Oct. 2004).

G. H. Golub et al, "Matrix Computations", Third Edition 1996, The Johns Hopkins University Press, pp. 520-537.

S. C. Eisenstat et al., "Yale Sparse Matrix Package I: The Symmetric Codes", International Journal For Numerical Methods in Engineering, vol. 18, 1145-1151 (1982), pp. 1145-1151.

L. T. Pillage et al., "Electronic Circuit and System Simulation Methods", McGraw-Hill, Inc., 1994, pp. 1-17.

J. L. Bentley et al., "Data Structures for Range Searching", Computer Surveys, vol. 11, No. 4, Dec. 1979, pp. 397-409.

Gupta et al. "A High Level Interconnect Power Model for Design Space Exploration", Intnl. Conference on Computer Aided Design, Nov. 9-13, 2003, pp. 551-558.

Office Action dated Jan. 29, 2007 in U.S. Appl. No. 10/976,653.
Amendment dated Apr. 30, 2007 in U.S. Appl. No. 10/976,653.
Office Action dated Jul. 27, 2007 in U.S. Appl. No. 10/976,653.
Office Action dated Jul. 3, 2006 in U.S. Appl. No. 10/976,411.
Amendment dated Nov. 3, 2006 in U.S. Appl. No. 10/976,411.
Office Action dated Jan. 18, 2007 in U.S. Appl. No. 10/976,411.
Interview Summary dated May 10, 2007 in U.S. Appl. No. 10/976,411.
Office Action dated May 1, 2007 in U.S. Appl. No. 10/976,411.
Amendment dated Sep. 4, 2007 in U.S. Appl. No. 10/976,411.

Gupta et al. "A High Level Interconnect Power Model for Design Space Exploration", Int'l. Conference on Computer Aided Design, Nov. 9-13, 2003, pp. 551-558.

Notice of Allowance dated Oct. 22, 2007 in U.S. Appl. No. 10/976,411.
Amendment dated Oct. 29, 2007 in U.S. Appl. No. 10/976,653.
Entire Prosecution History of U.S. Appl. No. 11/930,020, filed on Oct. 30, 2007.
Entire Prosecution History of U.S. Appl. No. 11/982,094, filed on Oct. 31, 2007.
Notice of Allowance dated Nov. 30, 2007 in U.S. Appl. No. 10/976,653.
Notice of Allowance dated Jan. 2, 2008 in U.S. Appl. No. 10/976,411.

* cited by examiner

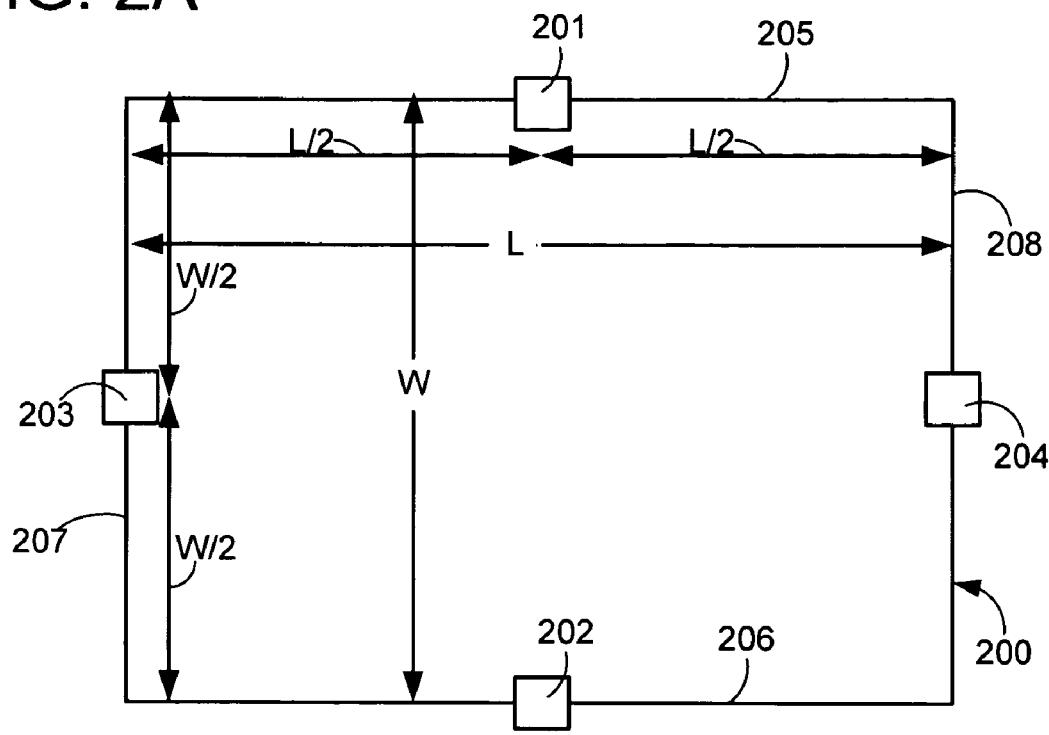
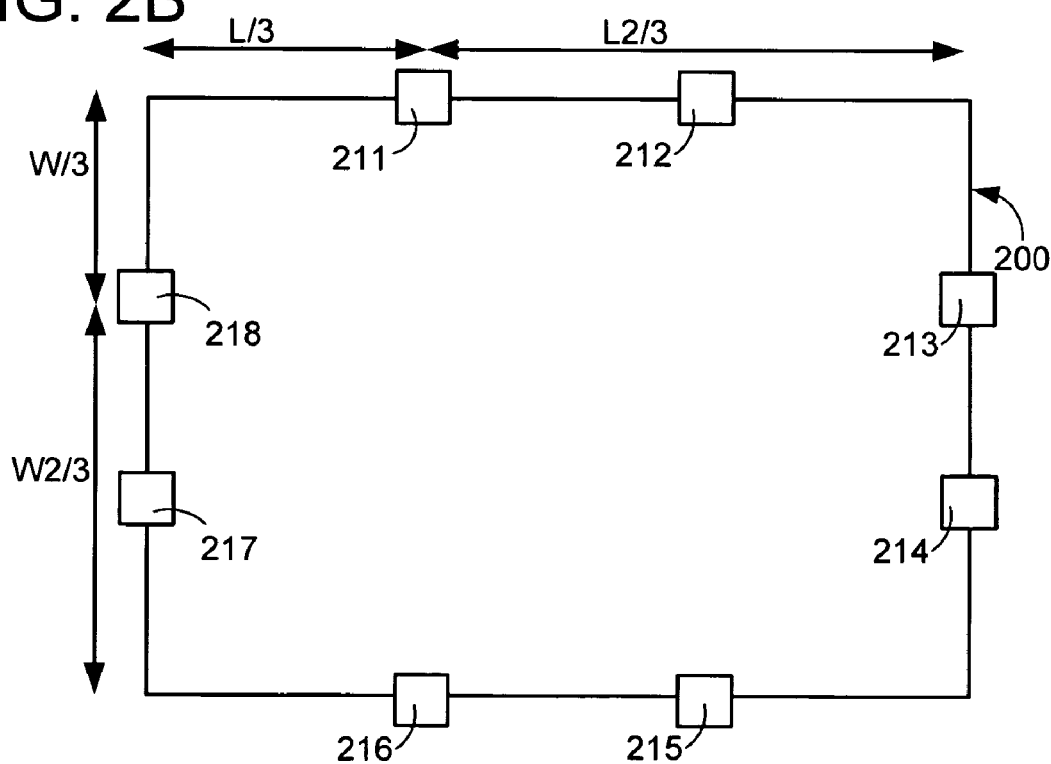

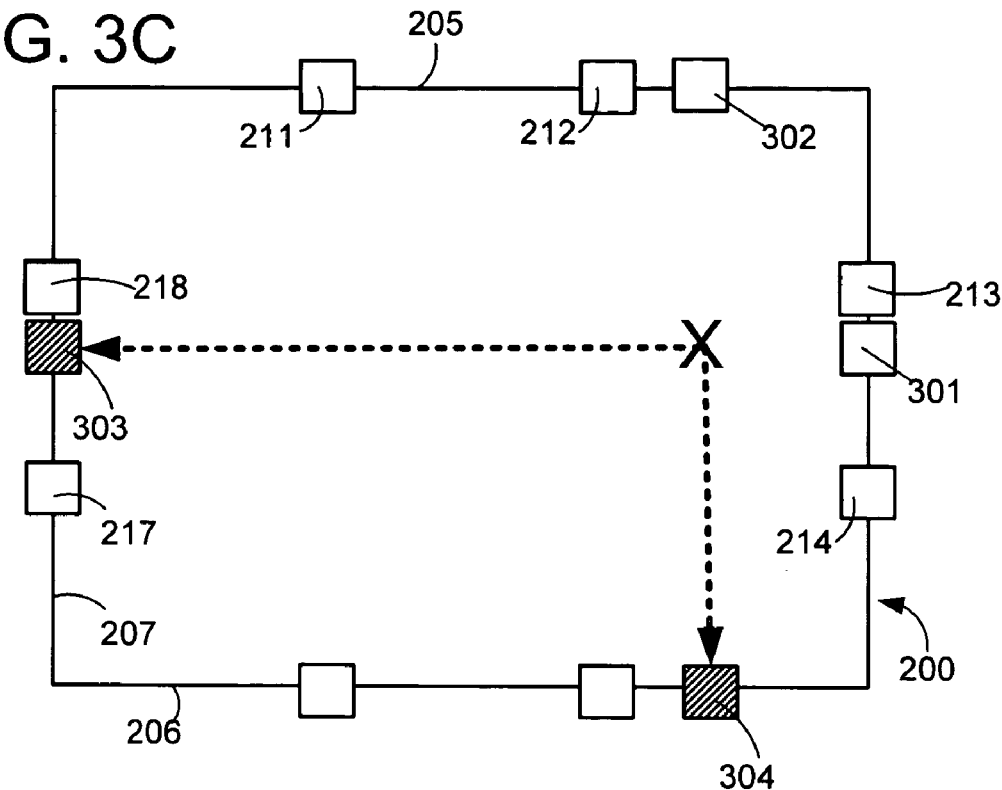
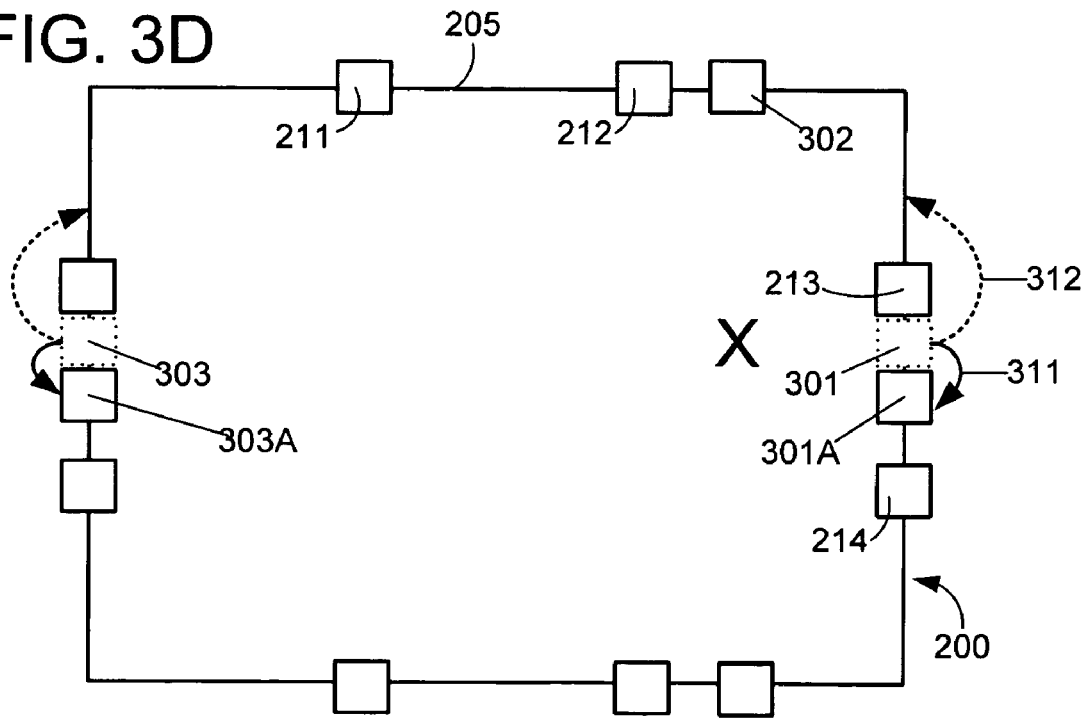

POWER PAD SYNTHESIZER FOR AN INTEGRATED CIRCUIT DESIGN

CROSS-REFERENCE TO RELATED APPLICATIONS

This application is related to and incorporates by reference herein in their entirety the following two commonly-owned, concurrently-filed and co-pending patent applications, including the CD-ROM appendices present therein:

U.S. patent application Ser. No. 10/976,411, entitled "POWER NETWORK SYNTHESIZER FOR AN INTEGRATED CIRCUIT DESIGN" filed by Yi-Min Jiang, Philip Hui-Yuh Tai, and Sung-Hoon Kwon; and U.S. patent application Ser. No. 10/976,653, entitled "POWER NETWORK ANALYZER FOR AN INTEGRATED CIRCUIT DESIGN" filed by Philip Hui-Yuh Tal, Yi-Min Jiang and Sung-Hoon Kwon.

CROSS-REFERENCE TO COMPUTER PROGRAM LISTING APPENDIX

An Appendix included in this patent application contains the following files in IBM-PC format compatible with MS-Windows in one CD-ROM (of which two identical copies are attached hereto), and this appendix is an integral part of the present disclosure and is incorporated by reference herein in its entirety:
Volume in drive D is 041029_1130
Volume Serial Number is EECA-B3A5
Directory of D:\
Oct. 27, 2004 11:14a 14,465 PAD.TXT
1 File(s) 14,465 bytes
0 Dir(s) 0 bytes free The above-identified file contains pseudo-code for use in preparation of a computer program for one embodiment of the invention.

BACKGROUND

1. Field of the Invention

The invention relates to design of semiconductor chips. More specifically, the invention relates to a method and an apparatus for generating a plan for adding power pads to a design of an integrated circuit.

2. Related Art

Pads that supply power in an integrated circuit (IC) design can be created in any of a number of different ways known in the prior art. For example, see a paper by M. Zhao, Y. Fu, V. Zolotov, S. Sundareswaran, and R. Panda, entitled "Optimal Placement of Power Supply Pads and Pins," in Proceedings of Design Automation Conference (DAC), pp. 165-170, 2004. This paper addresses a problem of finding an optimum set of pads, pins, and on-chip voltage regulators (all referred to as "pads"), and their placement in a given power supply network, subject to constraints on the voltage drops in the network and maximum currents through the pads. In this paper, the problem is modeled as a mixed integer linear program using macromodeling techniques and several heuristic techniques are described to make the problem tractable. This paper is incorporated by reference herein in its entirety.

See also another paper by J. Oh and M. Pedram, entitled "Multi-pad power/ground network design for uniform distribution of ground bounce," in Preceedings of DAC, pp. 287-290, 1998. This paper presents a method for power and ground (p/g) network routing for high speed CMOS chips with multiple p/g pads. Their objective is to distribute ground bounce evenly among the pads while the routing area is kept to a minimum. This paper shows that proper p/g terminal to pad assignment is necessary to reduce the maximum ground bounce and then presents a heuristic for performing simultaneous assignment and p/g net routing. This paper is also incorporated by reference herein in its entirety.

U.S. Pat. No. 6,405,357 granted to Chao, et al. on Jun. 11, 2002 entitled "Method for positioning bond pads in a semiconductor die" is incorporated by reference herein in its entirety. This patent describes (I) setting parameters including (a) setting a baseline pad pitch to a first value, (b) setting a first pad position equal to a first pad value and (c) providing a focal point; (II) determining a first angle between a first line through a center of the first pad position and the focal point and a second line through a center of the semiconductor die and normal to the edge; (III) determining a first pad spacing increment value equal to the first value divided by a cosine of the first angle; (IV) setting a second pad position equal to a second pad value, wherein the second pad value at least equals the first pad value plus the first value if both of the first bond pad and the second bond pad are ground pad or power pad with the same potential, else the second pad value at least equals the first pad value plus the first pad spacing increment value; and (V) using the first and second pad values to respectively position a first bond pad and a second bond pad along the edge of the semiconductor die. Beginning from the bond pad closest to the die corner, optimized positions of bond pads are determined by repeating steps I to V.

SUMMARY

A design of an integrated circuit (IC) device, in which locations of memory and/or logic circuitry (such as a standard cell or a hard macro cell) are identified, is used in a computer that is appropriately programmed (also called "power pad synthesizer") to automatically prepare a plan of locations of pads that are proposed to carry power. Specifically, the computer is programmed to identify proposed power pad locations in at least two stages as follows. In a first stage, a selected number of proposed power pads are placed around a periphery, either spaced uniformly relative to one another or based on a power distribution in the IC design. Next, the design, including the automatically proposed power pads (as well as manually proposed pads if any) is automatically evaluated by the computer to compute an attribute (such as maximum voltage drop) in the design. If the computed attribute value does not satisfy a predetermined condition (e.g. less than a user-specified limit that is scaled by a predetermined number), then the selected number is increased (e.g. multiplied by 2) and the just-described process is repeated. When the predetermined condition is met, a second stage is performed, as discussed next.

In the second stage, the computer automatically identifies a specific location in the design for having a value of the attribute that satisfies another predetermined condition (e.g. a location in the design at which the maximum voltage drop occurs). Then the computer automatically proposes one or more additional power pads at one or more peripheral locations that are identified by a predetermined rule based on the specific location. For example, four peripheral locations are identified at the periphery by requiring the x-coordinate or the y-coordinate to be identical to a corresponding coordinate of the specific location. The additional pads may be proposed to be at one or more of these four peripheral locations if available (i.e. unused), or at locations determined therefrom. Note that if two of the four peripheral locations happen to be in a corner, then one of them is omitted in some embodiments. Furthermore, two additional peripheral locations are identified adjacent to (e.g. on either side of) a peripheral location that is itself identified for having an attribute value that satisfies yet another predetermined condition (e.g. a peripheral location that carries maximum current).

Depending on the embodiment, a power pad synthesizer may perform the above-described acts in different order. Specifically, one power pad synthesizer uses the maximum voltage drop as a first condition to propose additional pads followed by use of the maximum current as a second condition to propose still more pads. An alternative power pad synthesizer applies these conditions in the reverse order by first using the maximum current to propose additional pads followed by use of maximum voltage drop. Other alternative power pad synthesizers apply only one of these conditions e.g. only use the maximum current or only use maximum voltage drop but not both. Such alternative power pad synthesizers may or may not use other conditions in addition to the just-described only one condition. Still other alternative power pad synthesizers apply one or both of these conditions in the second stage but do not perform the first stage in the manner described above, e.g. by receiving power pad locations identified by another tool or manually identified by the user. In such embodiments, if a set of previously proposed power pads are provided (either manually or via a tool), the power pad synthesizer of some embodiments computes the attribute and checks for compliance with the predetermined condition(s), and if so, no additional pads are proposed. Therefore, numerous power pad synthesizers will become apparent to the skilled artisan in view of this disclosure.

BRIEF DESCRIPTION OF THE FIGURES

FIGS. 2A-2D illustrates, in block diagrams, acts performed in the first stage 110 of FIG. 1 in some embodiments of the invention.

FIGS. 3A-3F illustrate, in block diagrams, acts performed in the second stage 120 of FIG. 1 in some embodiments of the invention.

DETAILED DESCRIPTION

Figure 1:
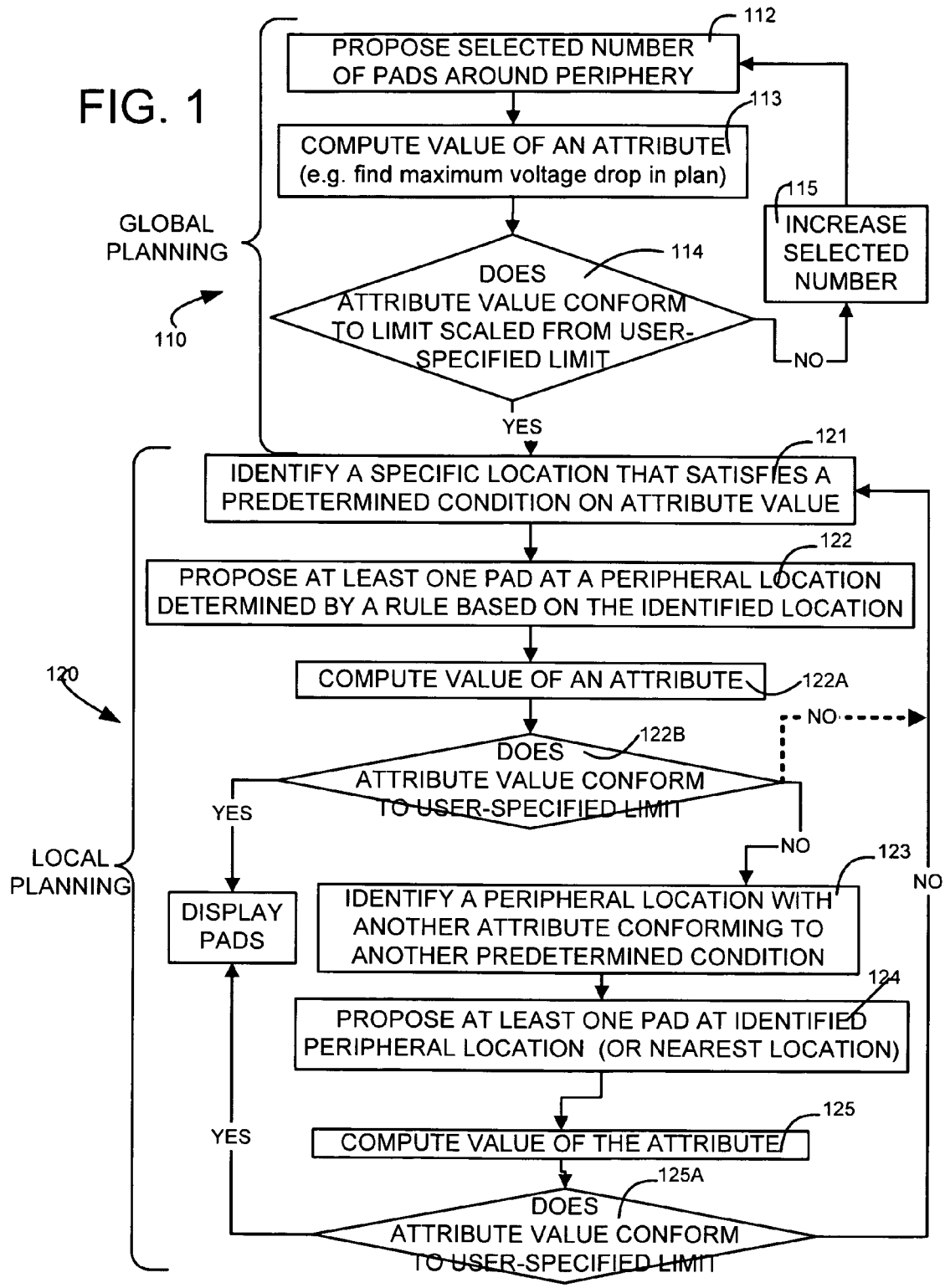
FIG. 1 illustrates, in a high-level flow chart in accordance with the invention, acts performed in two stages, to synthesize a plan for a power pads in an integrated circuit (IC) design.

A computer is programmed in accordance with the invention to receive a design of an integrated circuit device, in which locations of memory and/or logic circuitry (such as instances of standard cells or hard macros) have been identified, and automatically propose power pads and ground pads to be included in the design. Note that the term "power pads" is used generically to mean pads that can be at any predetermined voltage, e.g. Vdd or Vss or ground.

In some embodiments, the programmed computer receives the just-described information from an integrated circuit (IC) design database (such as, e.g. MILKYWAY available from Synopsys, Inc.) which holds a netlist produced by synthesis of a description originally expressed in a hardware description language, such as VERILOG or VHDL. The computer is programmed to retrieve from the database (located on a hard disk) and store into its memory, location data on the circuitry. Note that the programmed computer also has access to one or more libraries in the normal manner, such as a master file which identifies pin shapes, and a technology file which identifies information on various layers (such as metal layer 1, metal layer 2, . . . cut layer 1 etc).

Such a computer is programmed, in some embodiments of the invention, to automatically identify locations for proposing addition of power pads to the IC design in two or more stages, as follows. In a first stage 110, several power pads are proposed for addition to the IC design, at a global level, without regard to a specific location at which an attribute value occurs in the design, and when the attribute value satisfies a predetermined condition (e.g. maximum voltage drop falls below a user-specified limit that has been scaled up), then a second stage 120 is performed until the user-specified limit (without scaling) is reached for the attribute value. In the second stage 120, additional power pads are proposed for addition to the IC design, at peripheral locations that are derived from one or more specific locations at which the attribute value satisfies another predetermined condition (e.g. at which maximum voltage drop and/or maximum current occurs in the design).

Note that the user-specified limit on the maximum voltage drop may be based on a rule of thumb based on prior experience, e.g. set to 10% of supply voltage. Alternatively, the user-specified limit may be based on a maximum voltage drop in an IC design that obtained from a power network analyzer by using the maximum possible number of power pads Nmax as the pads to be proposed for addition to the IC design. The power network analyzer then provides a lower bound on the maximum voltage drop that can be achieved, by increasing the number of proposed power pads. The number Nmax is automatically computed in some embodiments (and supplied as input to the power network analyzer) based on space constraints, namely the pad size and the size of the chip.

For example, some embodiments, in which power pads for only a single net (Vdd or Vss) are being proposed, may simply divide chip width W (e.g. 100 microns) by pad width (e.g. 10 microns) to obtain the number of pads on a given side. Therefore, Nmax is 4*W/pad_width if the chip is a square of side W. In some embodiments, when pads for multiple-nets are being proposed (i.e. both Vdd net and Vss net), MNmax=4*W/Min_pad_width_among_mulple_nets if the chip is a square of width W, and MNmax/(number of multiple-nets) is used as the number of maximum possible pads per each net.

In several embodiments, a power pad synthesizer of the type described herein is programmed to automatically propose as many power pads as possible, on each side of a chip, and then compute the maximum voltage drop in that design. The just-described maximum voltage drop is then displayed to the user and the user then picks the user-specified limit to be a value larger than the displayed value (e.g. twice the displayed value). Note that instead of displaying the value at this stage, the value may be used as a lower bound in some embodiments, to check if the user-specified limit is reasonable.

In a first stage 110 shown in FIG. 1, a selected number of pads (e.g. four pads) are placed around a periphery as per act 112. The pads are placed spaced uniformly relative to one another in one embodiment. Specifically, as shown in FIG. 2A, four pads 201-204 are proposed, one on each of four sides 205-208 of a rectangle 200 which is the periphery of the IC design. Rectangle 200 has length L and width W and for this reason, two pads 201 and 202 are proposed on the top and bottom sides 205 and 206 at distances L/2 from the two vertical sides 207 and 208. Two pads 203 and 204 are proposed at the left and right sides 207 and 208 at distances W/2 from the two horizontal sides 205 and 206.

Note that the size of pads 201-204 is selected, in some embodiments, to be same as the size of an existing power pad cell that may be already present in the IC design, e.g. if one or more power pads are already defined by the circuit designer. If there are no power pads existing in the IC design, then the size of any power pad cell in a reference library is selected (e.g. randomly selected from among several power pad cells) in several embodiments. The reference library contains physical cell information about circuit elements (memory and/or logic) to be used in an integrated circuit design.

Next, the design including pads 201-204 is automatically evaluated by the computer to compute an attribute value of the design as a whole, as illustrated by act 113 (FIG. 1) in first stage 110. For example, the user may have specified a maximum voltage drop (which may be set by clicking the button labeled "Specified" illustrated in FIG. 4A, e.g. the user may then fill in "40" mV as the Target IR Drop in the adjacent field). In some embodiments, the maximum voltage drop is computed by a power network analyzer that is described in detail in U.S. patent application Ser. No. 10/976,653, which has been incorporated by reference above. Note that the power network analyzer of several embodiments reports back with a two dimensional array, which contains voltage drops at numerous locations throughout the entire IC design.

Note that in some embodiments, a set of power wires is already present in an IC circuit design, before act 112 is performed. If power wires are not currently in the IC circuit design, then a power network synthesizer is invoked before act 112. Although any power network synthesizer may be used, in some embodiments, a synthesizer of the type described in U.S. patent application Ser. No. 10/976,411, is used in some embodiments, to propose a network of power wires. Note further, that at this stage a set of power pads may be already present in the IC design or in a plan for addition to the IC design e.g. if power pads were previously added to the IC design by another tool, or if a plan is manually proposed by the user. Therefore, before act 112 is performed, such pre-existing power pads (regardless of whether manually provided or via a tool) are added to a data structure (e.g. KD tree) in which the proposed power pads are stored, so that a proposed power pad does not overlap any existing power pads. Note that such pre-existing power pads may also be created by a power pad synthesizer of the type described herein, e.g. if power pads are proposed in multiple operations, with a first operation to propose Vdd pads followed by a second operation to propose Vss pads.

Moreover, before act 112 is performed, extraction of resistance of the power wires in the IC design (or proposed power wires in a plan for the power network) is performed by a power network analyzer described in U.S. patent application Ser. No. 10/976,653, (to receive locations, identify points, estimate current and segment wires), as per acts 1110-1140 in FIG. 1A. Note that the just-described acts are performed by the power network analyzer only once in most embodiments to reduce the time required.

Next, in act 112 of the power pad synthesizer (see FIG. 1 of the current application), a number of power wires are proposed for connection between power wires (regardless of whether proposed or preexisting) and the power pads that are proposed in act 112. When proposing these connections, the layer of each pad at the periphery is automatically set to the layer of the nearest power wire of the same voltage level as the proposed power pad. Specifically, the Vdd wire that is nearest to a Vdd pad is found by horizontal and vertical searching from the proposed power pad's position. The nearest Vss wire to a Vss pad is found by horizontal and vertical searching from the Vss pad's position. Therefore, the power pads (Vdd or Vss) being proposed are connected to the corresponding power wires (Vdd or Vss) before act 113 is performed which computes the attribute value.

Then in act 113 (see FIG. 1 of the current application), the power pad synthesizer of this invention computes the attribute value by performing acts 1150 and 1160 of the analyzer of the power network analyzer described in U.S. patent application Ser. No. 10/976,653, (to estimate attributes, solve matrix equation and perform depth first search). Note that during iterations of the first stage 110, when act 113 is called repeatedly with different values of N, the acts 1150 and 1160 (in which a matrix is solved) are repeatedly performed, for each change in N, in the embodiments that use the analyzer of the above-referenced U.S. patent application Ser. No. 10/976,653 (note that extraction acts 1110-1140 of this power network analyzer are performed only once).

Figure 4A:
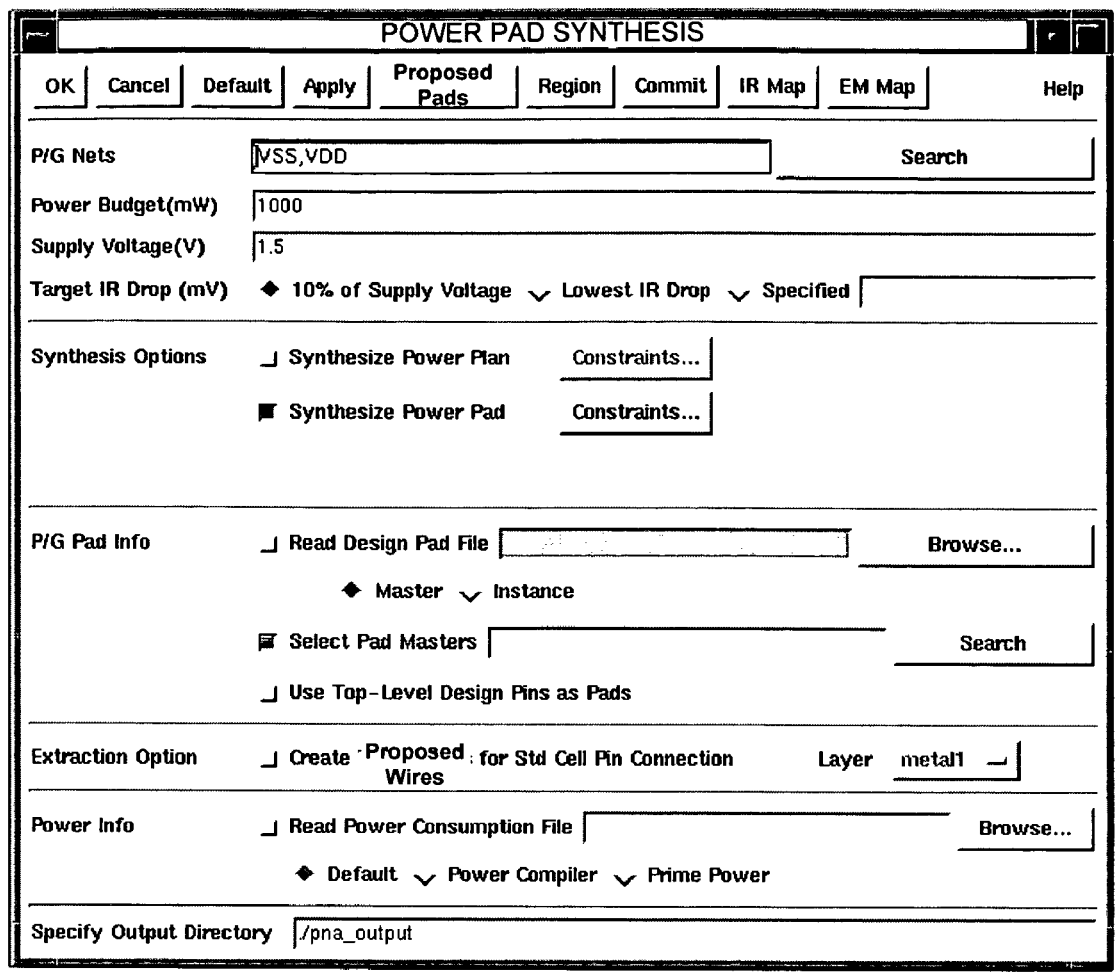
FIGS. 4A and 4B illustrate screens in a graphical user interface (GUI) displayed by a computer in one specific exemplary implementation of the invention.
Figure 4B:
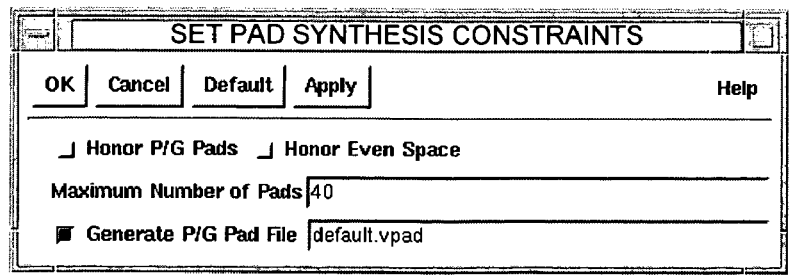

Note that although in some embodiments N=2 is used in the first iteration of the first stage 110 in act 112, in alternative embodiments, this value is picked based on a minimum number of pads to be automatically proposed that may be identified by the user, e.g. in a field shown in FIG. 4B. Note that the interface in FIG. 4B is displayed on clicking the "Constraints' button in FIG. 4A for synthesizing power pads. In such embodiments, N=log$_2$(minimum number of pads) is selected as the starting value of N for iterations in the first stage. Such user-specified value allows first stage 110 to skip iterations and save time. Various fields in FIG. 4A are as follows:

| | |
|---|---|
| P/G Nets | // nets to be synthesized |
| Power Budget(mW): | // estimated power budget for the given design |
| Supply Voltage(V): | // supply voltage used for the given design |
| Target IR Drop(mV) | // IR drop value(limit) to be specified by user |
| 10% of Supply Voltage: | // used as user-specified IR drop constraint |
| Lowest IR Drop: | // based on maximum #of all possible pads. |
| Specified | // specified by user |
| P/G Pad Info: | // existing power pads to be honored. |
| Read Design Pad File: | // power pads(names) file specified by user |
| Select Pad Masters: | // set power pad masters(names) in the design |

In some embodiments, a user may select "Create proposed wires for Std Cell Pin Connection" option in FIG. 4A to require generation of proposed power wires to be used for connection of each standard cell in the IC design to power wires currently being used in a power network analyzer (see U.S. patent application Ser. No. 10/976,653). Although this option takes additional computation time, accuracy in voltage drop estimates is increased because of more precise location of current sinks relative to each power wire (instead of approximating current from neighboring circuitry into current sinks at power wire intersections).

Note that FIG. 4A also allows the user to specify a power consumption file (e.g. to identify power distribution of a hard macro) towards the bottom of the screen shown in FIG. 4A. Moreover, the user may also specify an output directory to keep all files generated when power pad synthesis is completed. For example, the final voltage drop display files and a report file showing pad synthesis status are stored in this directory.

Referring to FIG. 4B, some embodiments, allow the user to request that the power pad synthesizer honor any preexisting P/G pads which might be already present in the IC design. In this case, power pad synthesizer receives these pads as input power pads and then proposes any additional power pads that may be needed to meet a voltage drop constraint. Such embodiments may also allow the user to request that the power pad synthesizer honor even spacing so that it will propose all pads at even space distribution only (e.g., only the 1st stage in FIG. 1 is performed) in order to get a quick pad synthesis result. The user may also specify the maximum number of pads that should be used in power pad synthesis. It is the one of constraints that stops power pad synthesizer. Finally, the user may specify a file to keep all synthesized pad information (e.g., net name, (x, y) location, layer.

Although in some embodiments, the analyzer described in U.S. patent application Ser. No. 10/976,653, is used, in other embodiments any other analyzer may be used in act 113 (FIG. 1). Specifically, one or more analysis acts of the type described in U.S. Pat. No. 6,523,154 are used in some embodiments of a power pad synthesizer of the type described herein.

In alternative embodiments, a different attribute is used in evaluation of the design including pads 201-204, depending on the target selected by the user, e.g. electro-migration is evaluated by using the power network analyzer to compute a maximum current in the entire design if the user specifies a limit on the maximum current. Alternatively, the maximum current density may be computed as (maximum current/wire width), and this attribute may be used instead of maximum current when evaluating electro-migration.

A maximum value in the two dimensional array is determined, e.g. by performing a search through the values generated by the power network analyzer. This search is performed in one embodiment by traversing the entire two dimensional array, while maintaining a variable to hold the maximum value encountered during the array traversal. Other embodiments may find the maximum value using any other method known in the art. Note that although a maximum value is being found in this embodiment, other embodiments may search for a minimum value depending on the attribute and the user-specified limit.

Next, as per act 114 in stage 110, if the attribute value (e.g. maximum voltage drop) that is determined during the automatic evaluation does not satisfy a predetermined condition (e.g. is not less than a user-specified limit that is scaled by a predetermined number), then the selected number is increased (e.g. multiplied by 2) as per act 115, and the just-described first stage acts are repeated (e.g. by returning to act 112 in FIG. 1). Note that the predetermined condition being checked in one specific embodiment is that a ratio of maximum voltage drop to a user-specified limit must be less than or equal to 1.7 (and greater than 1). In this example, if the ratio is greater than 1.7 then act 115 is performed.

Note that any ratio may be chosen depending on the embodiment, although many embodiments use a ratio in the range 1.3-3.5. The specific ratio that is used depends on the application, e.g. in IC designs that are substantially uniform at a global level (e.g. a static random access memory) the ratio may be reduced to 1.3, and in such embodiments a relatively small number of additional pads are placed by taking into account localized attribute values in second stage 120. On the other hand, embodiments that process IC designs that are non uniform at the global level may use a high ratio e.g. 3.5 so that a relatively large number of additional pads remain to be placed by second stage 120 and since this is done using localized attribute values the power pad distribution is more likely to achieve the user-specified limit (within other constraints such as the amount of computation time and a limit on maximum number of power pads).

In act 115 in this particular example, the number of pads is increased by placing two pads on each side for a total of eight pads. Therefore, in a repetition of act 112 eight pads 211-218 are placed around rectangle 200, with two pads being placed equidistant from one another, on each of the four sides 205-208 as illustrated in FIG. 2B. In this example, each pad is ⅓rd of the dimension (L or W) from a corner of the rectangle 200. Next, in act 113, the attribute value (e.g. maximum voltage drop) is again computed, this time on the IC design including eight pads 211-218.

Figure 2C:
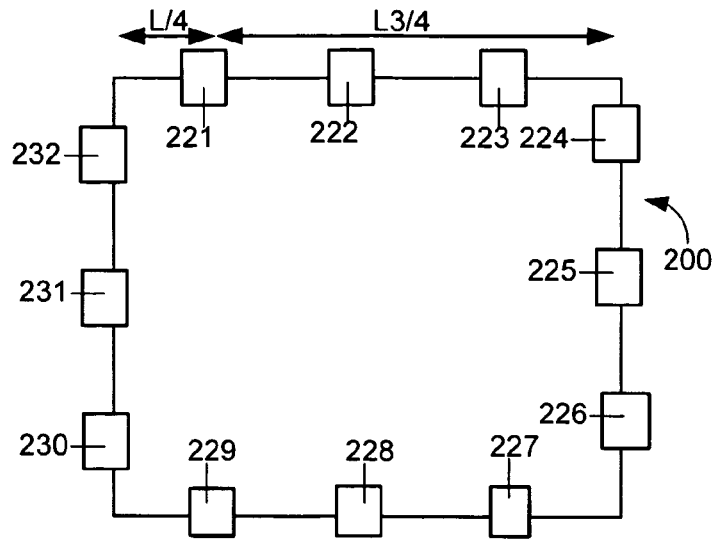
Figure 2D:
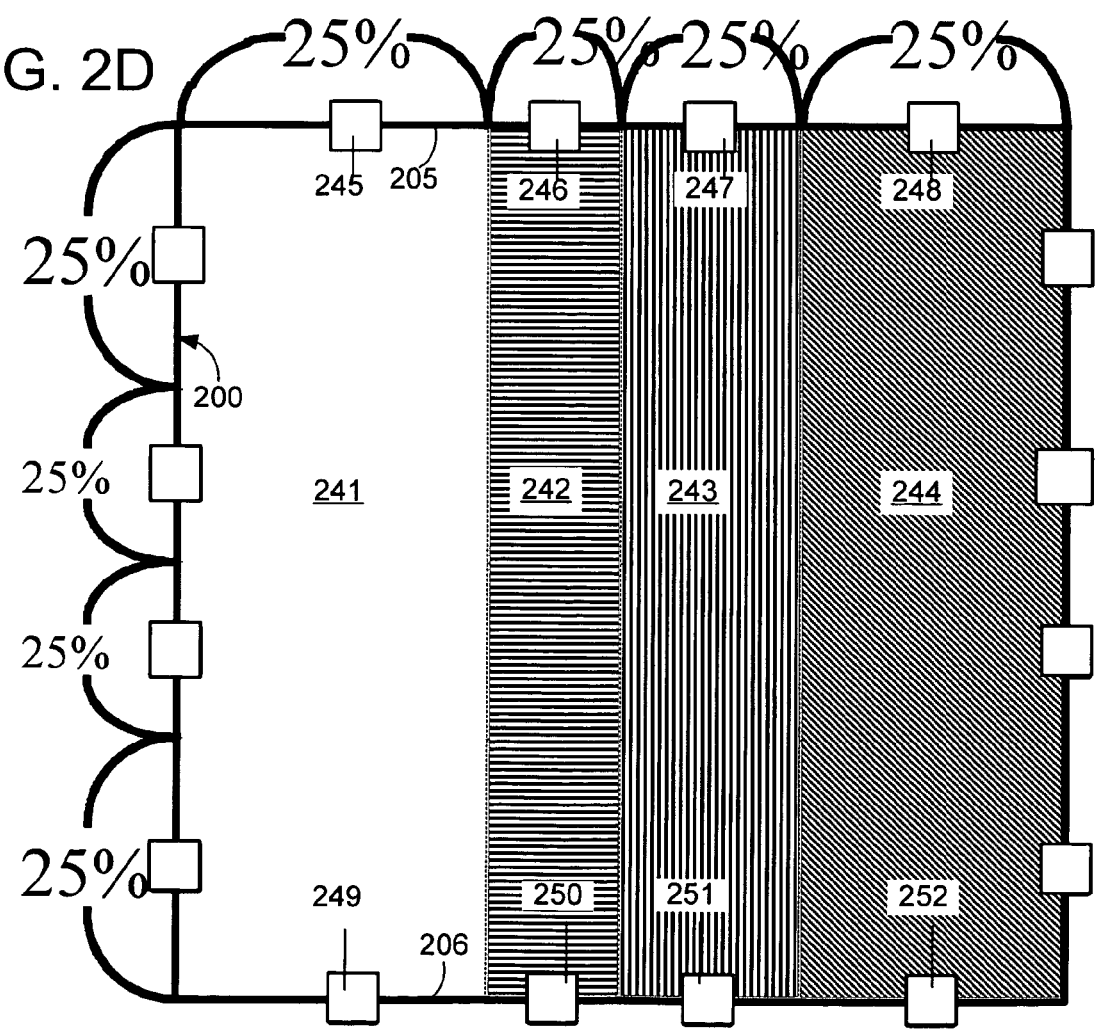

If this attribute value again doesn't satisfy the predetermined condition (in act 114) then the number of pads is again increased, by placing three pads on each side. Therefore, a total of twelve pads 221-232 which are placed around rectangle 200, with three pads being placed equidistant from one another, on each of the four sides 205-207 as illustrated in FIG. 2C. Note that in act 115, instead of increasing by one pad on each side, in an alternative embodiment the number of pads are simply doubled during each iteration, for example, starting with $2^2=4$ pads as illustrated in FIG. 2A, doubling to $2^3=8$ pads as illustrated in FIG. 2B, and again doubling to $2^4=16$ pads as illustrated in FIG. 2D if during each iteration the predetermined condition is not being met. Note that N is being incremented by 1 during each iteration of this alternative embodiment, with pad count equal to $2^N$.

Note that FIG. 2D illustrates an embodiment wherein the pads are placed not uniformly spaced relative to one another but uniformly located relative to distribution of power in rectangle 200. Specifically, rectangle 200 is divided into four blocks 241-244 that run vertically between the top side 205 and bottom side 206 of rectangle 200. Rectangle 200 is divided up such that each of four blocks 241-244 consumes the same power, which is 25% of the total power. Then pads 245-248 are placed in the center of the top side of each block 241-244. Similarly pads 249-252 are placed in the center of the bottom side of each block 241-244. Thereafter, the division of rectangle 200 into blocks is again repeated, this time with the new blocks (not shown) being oriented horizontally instead of vertically, followed by placement of the remaining pads as shown in FIG. 2D.

Note that pad placement based on power distribution as illustrated in the embodiment of FIG. 2D is performed with any number of pads although a total of sixteen pads are illustrated in FIG. 2D. Note also that the power distribution being taken into account is being averaged (by blocking) along one dimension in this example of FIG. 2D, and furthermore a different condition (unrelated to power) is used in act 114. Therefore, a specific location in the design, of where an attribute value occurs (i.e. the attribute value which is used in checking the predetermined condition in the first stage in act 114) is not taken into account during the first stage of any of the embodiments described herein. Instead, in most embodiments of the invention, in the first stage, power pads are added at a global level, based on e.g. maximum voltage drop regardless of where it occurs, and a user-set maximum number of pads.

Figure 3A:
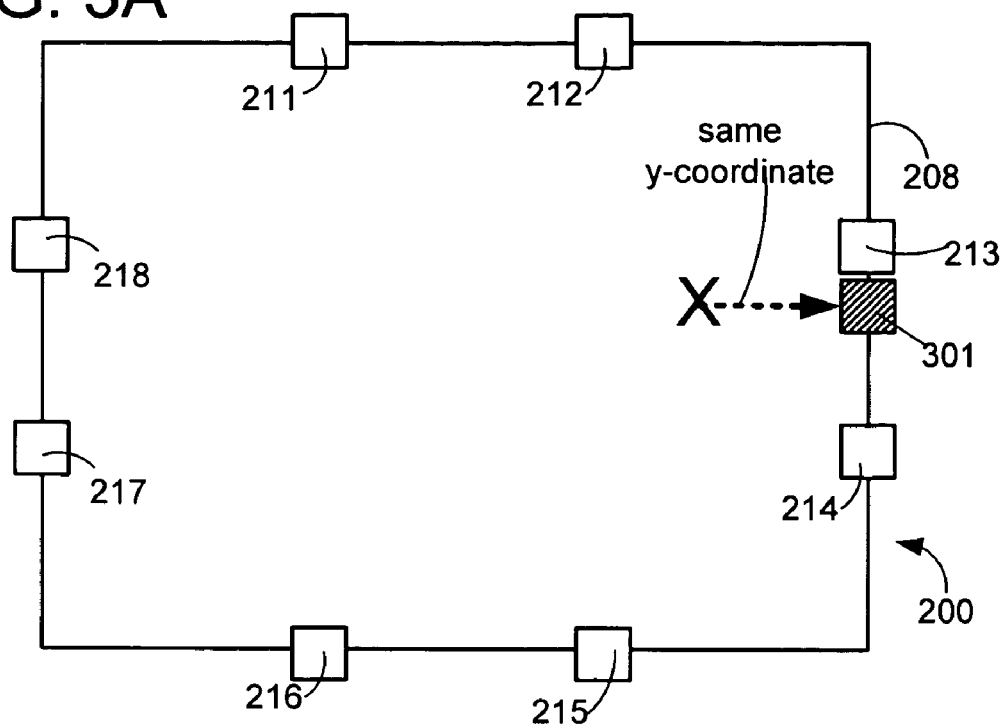

When the predetermined condition is met in act 114 (FIG. 1), then a second stage 120 is performed at the local level, which takes into account a specific location in placing pads. In second stage 120, the computer automatically identifies (as per act 121 in FIG. 1) one or more specific locations in the design for having a value of the above-described attribute that satisfies another predetermined condition. In some embodiments, the predetermined condition is for the specific location to have a maximum attribute value. Hence, in the above described example, a location interior to the design at which the maximum voltage drop occurs is found. An example of such a location is marked "X" in FIG. 3A.

Note that in the just-described example, the same attribute, voltage drop, is being used in the first stage and also in the second stage. In the first stage a maximum value of the voltage drop is used as a terminating condition in act 114, whereas in the second stage a location having the maximum voltage drop is used to place additional pads, such as pad 301 on rectangle 200 in FIG. 3A, as discussed in the next paragraph. Also, as discussed later in reference to FIG. 3F a different attribute, namely a location of maximum current is further used in this embodiment, to place even more additional pads on rectangle 200.

Figure 3B:
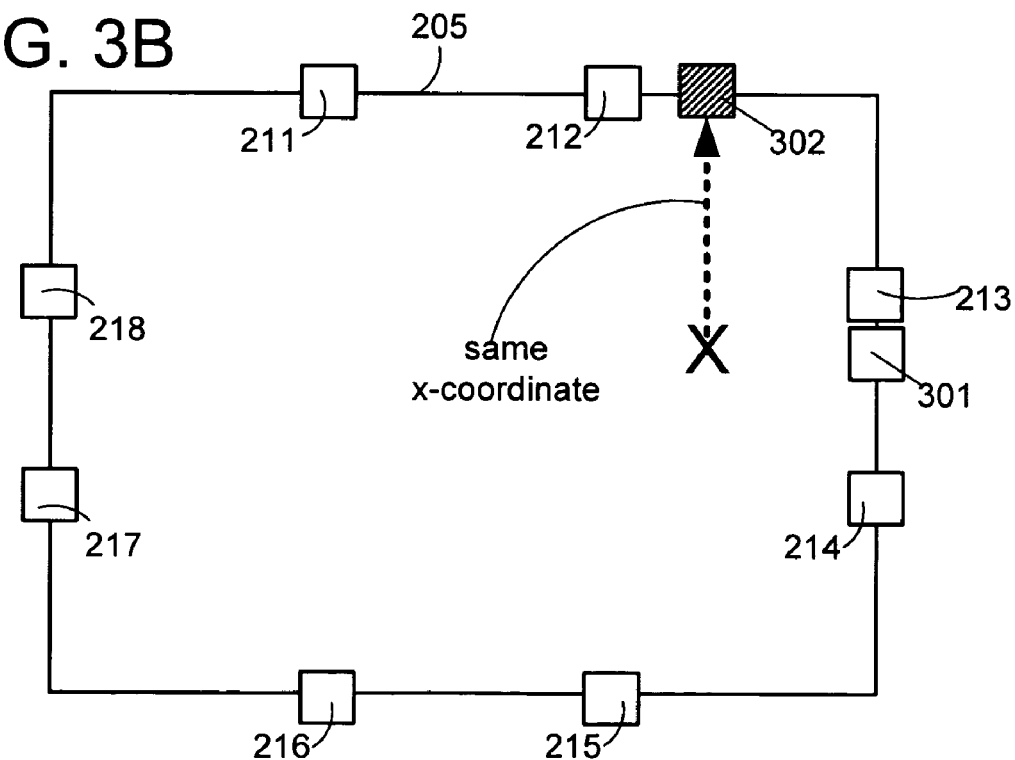

In second stage 120, the computer automatically places (as per act 122) one or more additional pads at one or more peripheral locations that are identified by a predetermined rule based on the specific location marked "X" which has the maximum voltage drop in this example. Hence, in this example, a first peripheral location 301 is identified, at the right side 208, of the periphery formed by rectangle 200 (FIG. 3A), by keeping the y-coordinate of 301 same as the y-coordinate of the specific location marked "X." A second peripheral location 302 is identified, at the top side 205 of rectangle 200 (FIG. 3B), by keeping the x-coordinate of 302 same as the x-coordinate of the specific location marked "X." Similarly, third and fourth peripheral locations 303 and 304 are identified, at the respective sides 207 and 206 of rectangle 200 (FIG. 3C), by keeping the x and y coordinates same as the corresponding coordinates of the specific location marked "X."

Therefore, additional pads are placed, as per act 122, at one or more of these four peripheral locations 301-304, depending on certain predetermined conditions that are used in some embodiments as follows, wherein ALPHA is 1.7 in the above-described example, and IR_ratio is the ratio of maximum voltage drop at the specific location marked "X" and the user-specified limit on voltage drop. Specifically, all four pads 301-304 are added to the list of pads from first stage 110, if IR_ratio>Alpha−(Alpha−1)*0.25

Three closest pads 301, 302 and 304 are added if

Alpha−(Alpha−1)*0.5<IR_ratio<=Alpha−(Alpha−1)*0.25

Two closest pads 301 and 302 are added if

Alpha−(Alpha−1)*0.75<IR_ratio<=Alpha−(Alpha−1)*0.5

A single closest pad 301 is added if

IR_ratio<=Alpha−(Alpha−1)*0.75

Therefore, the above-described conditions select fewer numbers of locations at which pads are added in the second stage, as the IR_ratio at the specific location decreases (i.e. as the IC design gets closer to the user-specified limit on the attribute value).

Note that the above-described numbers of pads (1, 2, 3 or 4) are proposed (as per act 122) at their respective locations by some embodiments only under certain conditions as discussed next. Specifically, several embodiments check if these locations are not available for some reason, e.g. too close to another block as per design-rule-checking (DRC) constraints, or already occupied (or blocked) wholly or partially by pads that were previously proposed. If a location is unavailable, then one or more nearby locations are checked for availability. A newly-proposed location is unavailable if another pad is already present (or already proposed) at or near to the newly-proposed location, as determined by a function (e.g. that traverses a four dimensional KD tree) to find an intersection of the newly-proposed location with previous pad locations (e.g. stored in the KD tree). Note that the newly-proposed location is expanded in some embodiments, e.g. by the size of a DRC constraint, to find previously (present or proposed) pad locations that are too near but not precisely at the newly-proposed location.

In the above-described example location 301 is not available as illustrated in FIG. 3D because of DRC constraint on minimum spacing, and for this reason an alternative location 301A is checked as shown by arrow 311. This alternative location 301A is automatically identified by the programmed computer by searching in one of the two directions (e.g. downward) along the periphery, from location 301. The distance at which location 301A is checked may be predetermined e.g. as being three pad widths away in some embodiments and as seven pad widths away in other embodiments. In some embodiments one of these two multiples (3 and 7) are used depending on the size of the pads, as shown below wherein height is L and width is W (as shown in FIG. 2). Note that in the following calculations, the number 50 may be replaced by another number, depending on the embodiment.

```
vpad_size = MIN(height, width) / 50;
if(vpad_size < 3*Input_Pad_Size)
    search_interval = 3*Input_Pad_Size;
else if(vpad_size >= 3*Input_Pad_Size and vpad_size < 7*Input_Pad_Size)
    search_interval = 7*Input_Pad_Size;
else
    search_interval = vpad_size / Input_Pad_Size
```

If, for any reason, the alternative location 301A is not available, then the search is repeated in the opposite direction (e.g. upward) from location 301, as shown by arrow 312. In the illustrated example, location 303 is also not available for the same reason as location 301, and hence alternative location 303A is checked, and if necessary another search is also performed in the upward direction.

Figure 3E:
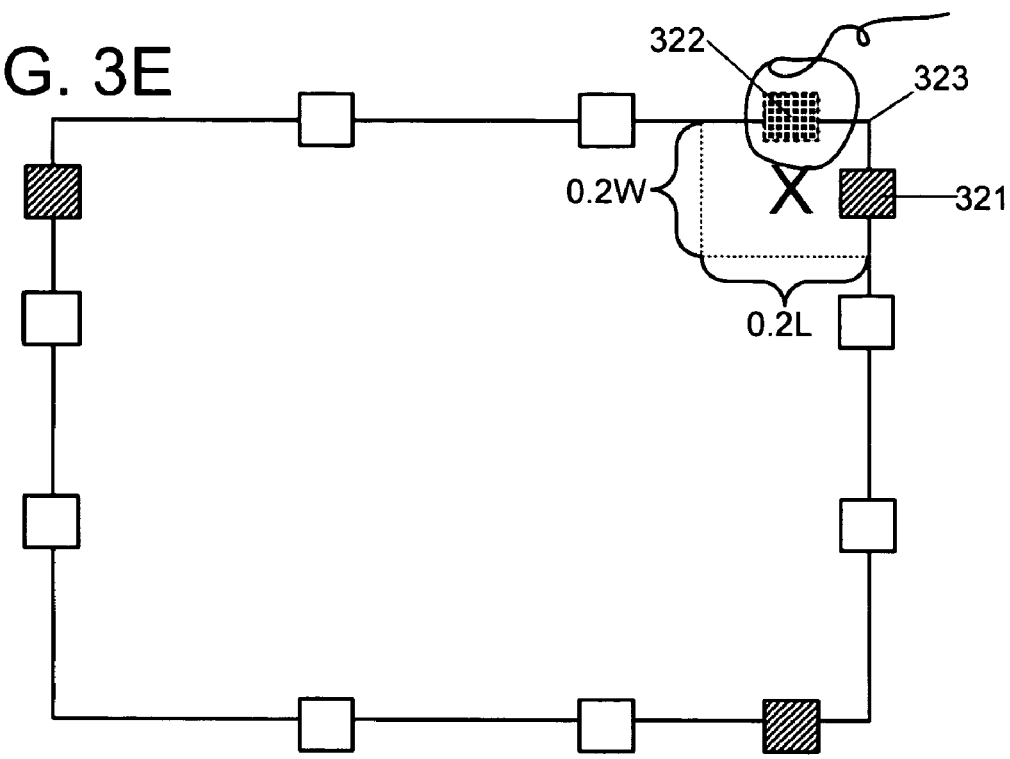

Note that if the specific location marked "X" happens to be near a corner (which is defined in some embodiments be within 20% of the dimensions L and W from the corner), then only one of two locations on the periphery that are near to the corner is used to add a new pad during act 122 (FIG. 1). In an example illustrated in FIG. 3E, a specific location marked "X" is shown to be near a corner 323, because corner 323 can be reached by traveling less than 0.2W and 0.2L distances along the respective coordinates. For this reason, although two locations 321 and 322 can be used for placing pads, only one pad is placed at location 321 (which, among these two locations, is the closest to the specific location marked X). Specifically, a power pad is added to a location that is closest to "X" and the other location is not used. Therefore, a new pad is not added at location 322 even though all other conditions may be satisfied.

After addition of one or more pads in act 122, an attribute value at multiple locations in the IC design is computed in act 122A, e.g. by invocation of a power network analyzer, specifically to solve a matrix as discussed elsewhere herein. Note that the attribute value being determined in act 122A may be related to the attribute value in act 113, e.g. voltage drop is determined in act 122A in some embodiments wherein the maximum voltage drop is determined in act 113. Next, in act 122B, a check is made as to whether a maximum voltage drop, across all locations in the IC design, is below the user-specified limit (which is not scaled up in this act 122A). If so, then the pads that have been added so far are displayed to the user, or otherwise used in a further step. If the answer in act 122B is no, then in one embodiment, acts 123-125A may be performed as discussed next. Note that in another embodiment, acts 123-125A are skipped and control returns from act 122B directly to act 121 discussed above.

Figure 3F:
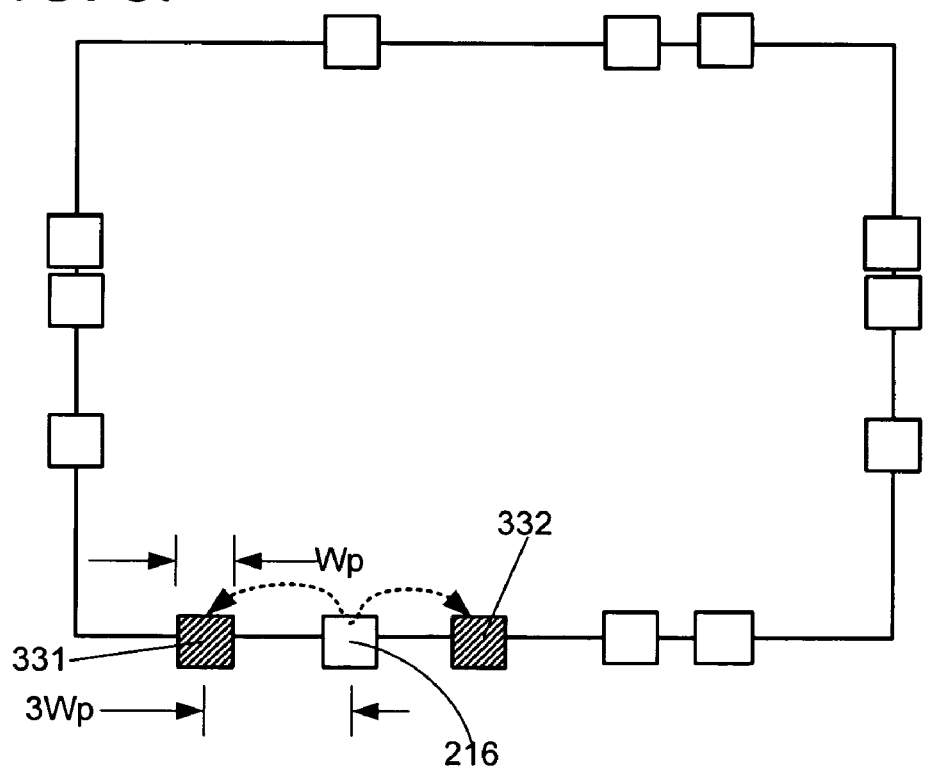

FIG. 3F illustrates the performance of acts 123 and 124 which are optional acts and hence performed in some embodiments but not performed in other embodiments. Note that if acts 123 and 124 are not performed, then control transfers from act 122 directly to act 125. Acts 123 and 124 are similar to acts 121 and 122 discussed above, except that a different attribute, namely current is used in the predetermined condition (instead of voltage drop). Note that current is calculated in act 113, as an intermediate result (a by-product) of calculating the voltage drop.

Figure 4C:
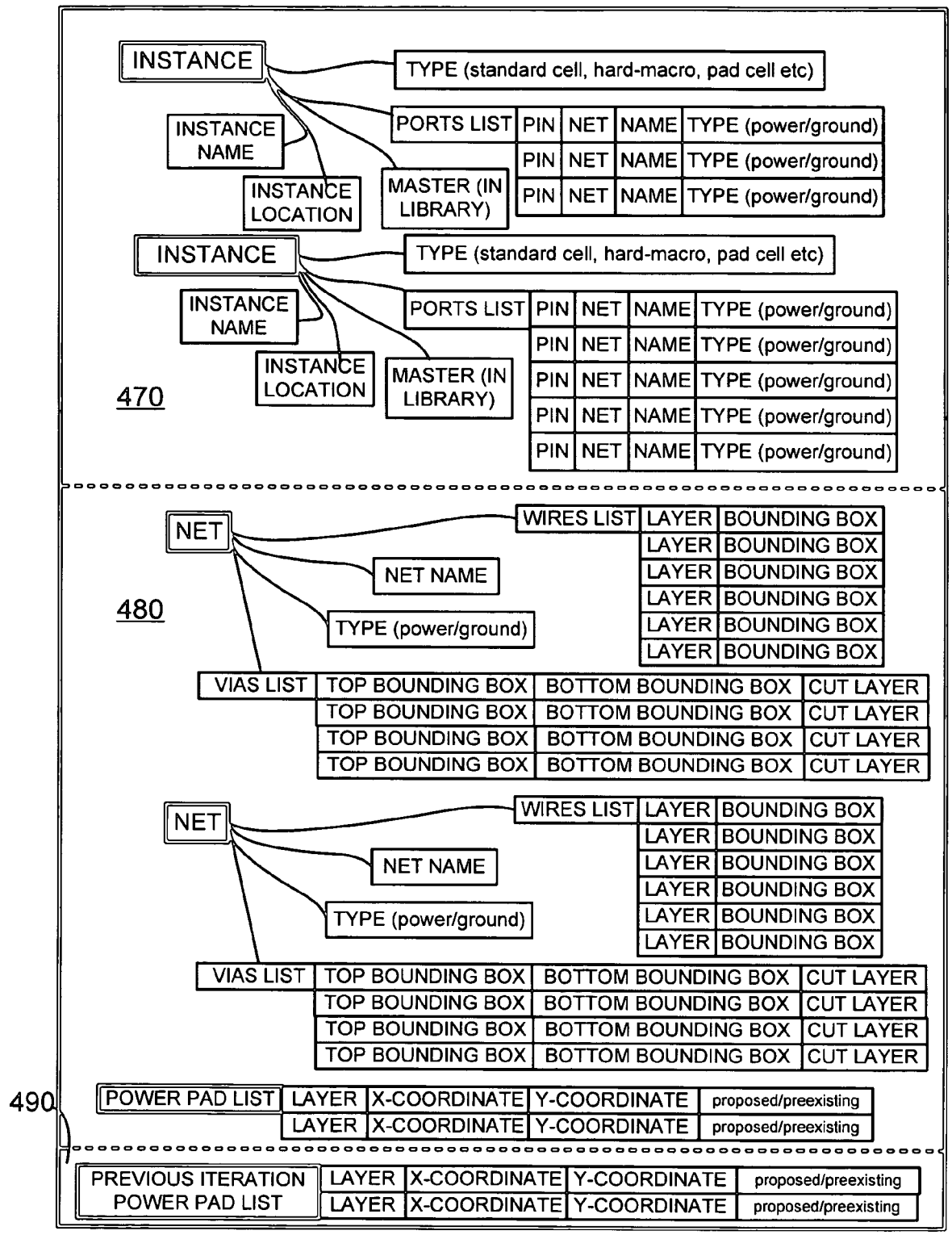
FIG. 4C illustrates, in a block diagram, data structures in the memory of a programmed computer when performing the method of FIG. 1, in the exemplary implementation.

Note that data in a main memory of the computer (see FIG. 4C) may be used to identify a peripheral location 216 (FIG. 3F) that has maximum current. At this point, it is helpful to understand the various data structures in the computer's main memory as shown in FIG. 4C that are used in the various acts described herein. Specifically, data 470 in the computer's main memory (FIG. 4C) is retrieved from a database in persistent storage that holds information on various instances in the IC design (e.g. standard cells, pad cells and hard macro cells), and this information is typically used to initialize a power pad synthesizer, a power network analyzer and a power network synthesizer of the type described herein. Additionally, data 480 in the computer's main memory (FIG. 4C) holds information on power networks and power pads actively worked on by the just-described three tools, and this data includes not only proposals for power wires and power pads but also any such data that is preexisting (which may be either previously proposed or retrieved from the IC design database from persistent storage such as a hard disk).

Referring to FIG. 3F, a power pad synthesizer of the type described herein may automatically identify two additional peripheral locations 331 and 332 adjacent to (e.g. on either side of) peripheral location 216. The locations 331 and 332 may be identified as having the same y coordinate as location 216, and being located on the periphery at a predetermined distance therefrom, e.g. three pad widths away. Either or both of these locations 331 and 332 may be used to add new pads, either unconditionally in some embodiments or only if certain conditions are satisfied in other embodiments. Conditions that are applied in act 124 of some embodiments are similar or identical to the conditions described above for act 122. In other embodiments, two pads 331 and 332 are added to the list of pads, if $$IR\_ratio > Alpha - (Alpha - 1) * 0.5$$

Only one closest pad 331 is added if $$IR\_ratio <= Alpha - (Alpha - 1) * 0.5$$

Note that some embodiments allow the user to specify an upper limit on the number of pads, which is illustrated as "40" in FIG. 4B. In such embodiments, pad synthesis is stopped when this maximum number is reached, regardless of whether or not other predetermined conditions are met (e.g. if this condition is reached in the first stage then the second stage is not performed). Therefore, acts 114, 122B and 125A are modified to check for this limit on maximum number of pads, as well.

After act 124 is performed (see FIG. 1), then once again the attribute values are computed (as per act 125) throughout multiple locations in the IC design in a manner similar or identical to act 122A. Thereafter, control transfers to act 125A which is also similar or identical to act 122B discussed above.

Note also that in some embodiments, a list of power pads proposed in a previous iteration of first stage 110 is saved in the computer's main memory as data 490 illustrated in FIG. 4C, before a new list of power pads is created. A new power pads list in data 480 is replaced by the previous power pad list in data 490 (i.e. the current iteration is un-done or rolled-back), if the new power pads list causes the attribute value to conform to another predetermined condition (e.g. if the maximum voltage drop becomes lower than the user-specified limit). Such use of the previous iteration's power pads list in data 490 ensures effectiveness of the second stage in performing localized pad placement, which results in fewer power pads being used (than if the new power pads list is used).

Figure 5:
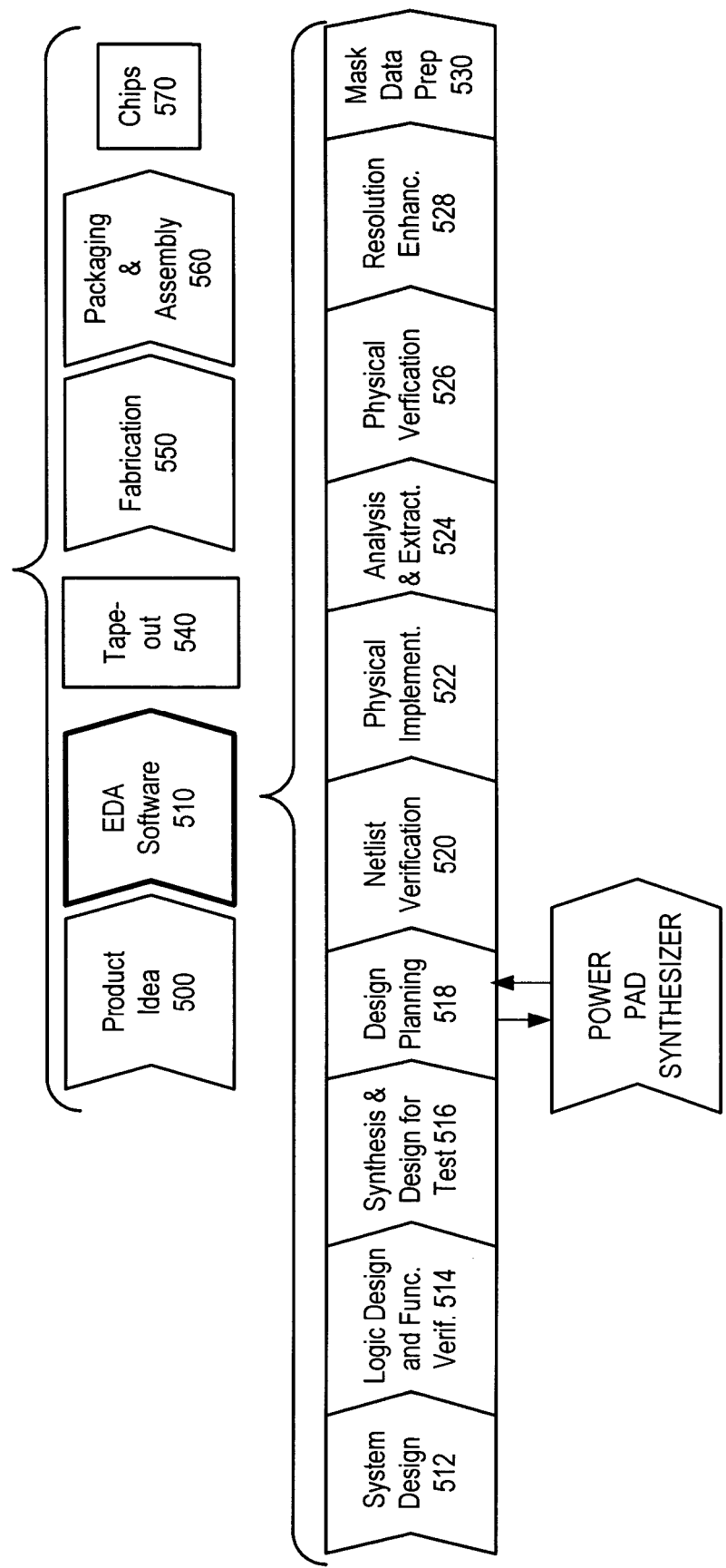
FIG. 5 illustrates, a simplified representation of an exemplary digital ASIC design flow in accordance with the invention.

It may be helpful to place this process in context. FIG. 5 shows a simplified representation of an exemplary digital ASIC design flow. At a high level, the process starts with the product idea (500) and is realized in a EDA software design process (510). When the design is finalized, it can be taped-out (event 540). After tape out, the fabrication process (550) and packaging and assembly processes (560) occur resulting, ultimately, in finished chips (result 570).

The EDA software design process (510) is actually composed of a number of stages 512-530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

Figure 4D:
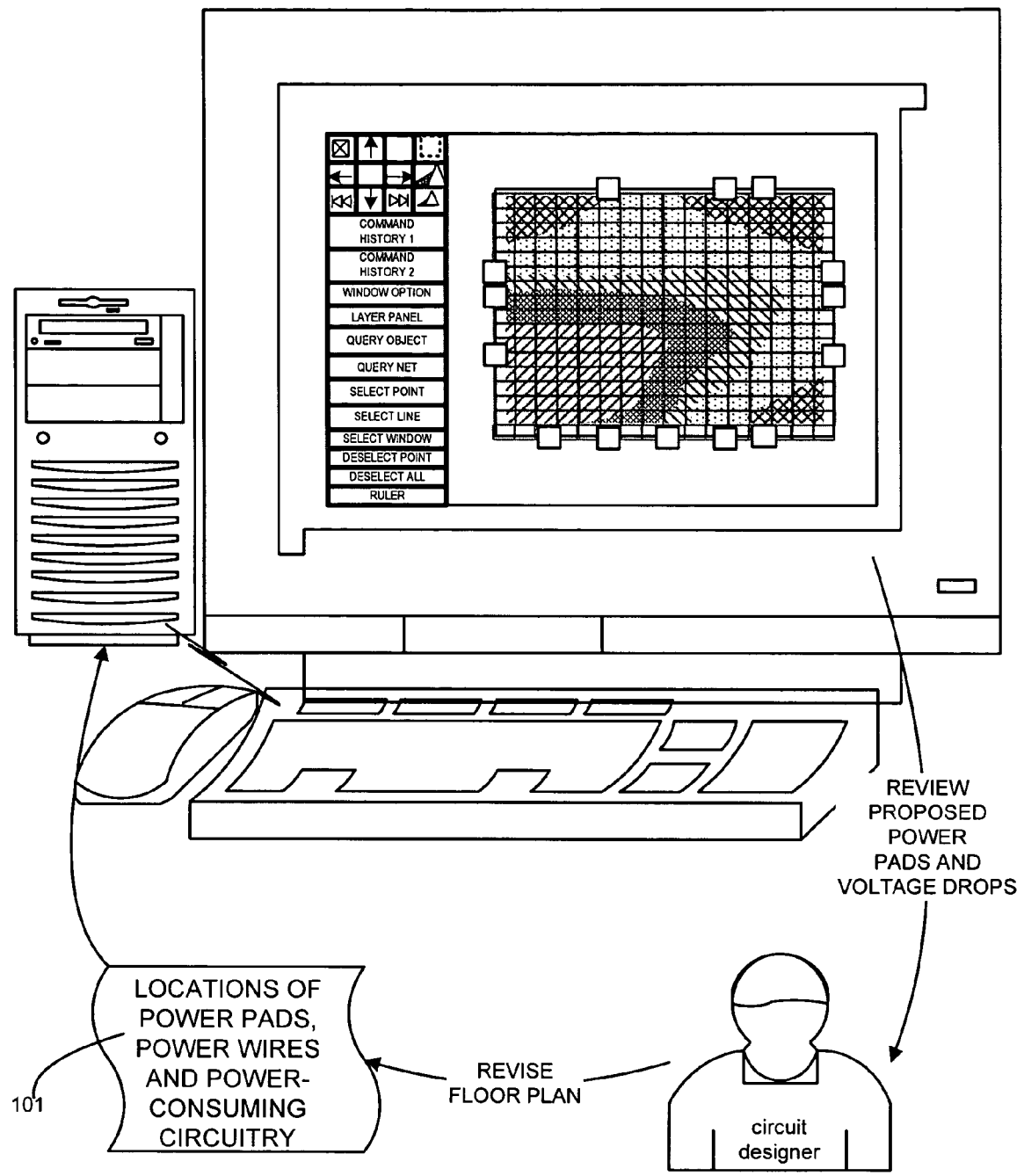
FIG. 4D illustrates, in a block diagram, the computer of FIGS. 4A, 4B and 4C displaying results in the exemplary implementation to a human.

A brief description of the components of the EDA software design process (stage 510) will now be provided:

System design (stage 512): The circuit designers (FIG. 4D) describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 514): At this stage, the VHDL or Verilog code for modules in the system is written and the design (which may be of mixed clock domains) is checked for functional accuracy. More specifically, does the design as checked to ensure that produces the correct outputs. Exemplary EDA software products from Synopsys, Inc. that can be used at this stage include VCS, VERA, DesignWare®, Magellan, Formality, ESP and LEDA products.

Synthesis and design for test (stage 516): Here, the VHDL-Nerilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 518): Here, an overall floorplan for the chip is constructed and analyzed for timing and top-level routing. Exemplary EDA software products from Synopsys, Inc. that can be used at this stage include Jupiter and Floorplan Compiler products. Note that various acts of the type described above in reference to FIG. 1 are performed in stage 518 of some embodiments. In many embodiments, a user views the effect of proposed power pads on voltage drop throughout the IC design even before any power pads are added to the IC design. Depending on whether or not the voltage drop (or other attribute value) is found satisfactory, the user may simply not add any proposed power pads and instead go back to floor planning to change their IC design (which change is made easier in the absence of such power pads).

Although circuitry and portions thereof (such as instances of standard cells or preexisting wires and/or pads) are described herein as if they exist in the real world, it is to be understood that at this stage only a computer model exists in a programmed computer (FIG. 4C). The actual circuitry in the real world is created after power pads that are proposed by a power pad synthesizer of the type described herein are added to the IC design (based on user approval), when the modified IC design (containing power pads) is further processed as discussed next.

Netlist verification (stage 520): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 522): The placement (positioning of circuit elements) and routing (connection of the same) occurs at this step. Exemplary EDA software products from Synopsys, Inc. that can be used at this stage include the Astro product.

Analysis and extraction (stage 524): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 526): At this various checking functions are performed to ensure correctness for: manufacturing, electrical issues, lithographic issues, and circuitry. Exemplary EDA software products from Synopsys, Inc. that can be used at this include the Hercules product.

Resolution enhancement (stage 528): This involves geometric manipulations of the layout to improve manufacturability of the design. Exemplary EDA software products from Synopsys, Inc. that can be used at this include iN-Phase, Proteus, and AFGen products.

Mask data preparation (stage 530): This provides the "tapeout" data for production of masks for lithographic use to produce finished chips. Exemplary EDA software products from Synopsys, Inc. that can be used at this include the CATS(R) family of products.

The data structures and software code for implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the process of FIG. 1.

Numerous modifications and adaptations of the embodiments described herein will become apparent to the skilled artisan in view of this disclosure.

Although two stages are used in some embodiments, other embodiments may use three or more stages. For example, after the second stage, an additional stage may be used to improve the location of power pads, e.g. by use of manual input from a circuit designer to relocate (or even eliminate) pads supplying low current as compared to other power pads, thereby to reduce the number of pads and/or maximum voltage drop. Moreover, although two conditions are described above as being used in some embodiments to perform the localized pad placement in the second stage, other embodiments may use more limitations or different limitations, such as maximum current density.

Note that the power pads of some embodiments are not related in any manner to instances in the IC design (such as standard cells or macro cells), although in other embodiments one or more such power pads are connected to instances (e.g. to a standard cell or a hard macro cell).

Although in some embodiments a single ring of pads is created as illustrated in FIGS. 2A-2D and 3A-3F, in other embodiments alternating pads are placed on two different rings, which may be either on the same layer concentric with one another or on different layers depending on the embodiment.

Numerous modifications and adaptations of the embodiments described herein are encompassed by the scope of the invention.

An appendix that is located in a file "pad.txt" in the attached CD-ROM provides illustrative pseudo code for one exemplary embodiment in accordance with the invention. As noted above, this file is an integral portion of this detailed description and is incorporated by reference herein in its entirety. Note that the pseudo code contains functions for using a KD tree that are identical to corresponding KD tree functions used in a power network analyzer of the type described in the related U.S. patent application Ser. No. 10/976,653, except for the lines marked with three asterisks as "/***/".

What is claimed is:

1. A method of synthesizing pads for an integrated circuit device, the method being performed in a computer, the method comprising:

automatically placing a plurality of pads around a periphery in a design of said integrated circuit device, based on a limit on an attribute of said design regardless of location, said design comprising a network interior to said periphery;

automatically identifying from among a plurality of locations in the design, a specific location for having a value of said attribute satisfying a predetermined condition;

automatically placing a first pair of additional pads on said periphery, at a first pair of additional locations identified based on a first coordinate of the specific location;

automatically placing a second pair of additional pads on said periphery, at a second pair of additional locations identified based on a second coordinate of the specific location; and storing in a memory of the computer, said plurality of pads, said first pair of additional pads and said second pair of additional pads.

2. A method of synthesizing pads for an integrated circuit device, the method being performed in a computer, the method comprising:
- automatically placing a plurality of pads around a periphery in a design of said integrated circuit device, said design comprising a network interior to said periphery;
- automatically computing a plurality of values of an attribute at a corresponding plurality of locations in the network;
- automatically placing at least one additional pad at a peripheral location identified by a predetermined rule based on at least one value in the plurality of values; and
- storing in a memory of the computer, said plurality of pads and said at least one additional pad;
- wherein said automatically placing of the plurality of pads comprises:
- (a) temporarily placing a selected number of pads;
- (b) searching a two dimensional array of values of voltages at the corresponding plurality of locations to find a maximum voltage drop in the design; and
- if a ratio of the maximum voltage drop to a user-specified limit on the maximum voltage drop is greater than a predetermined limit on the ratio: removing the selected number of pads placed in said (a) temporarily placing, increasing the selected number to obtain a new selected number, and repeating based on the new selected number said (a) temporarily placing and said (b) searching.

3. The method of claim 2 wherein:
the new selected number is twice the selected number.

4. The method of claim 2 wherein:
the predetermined limit is 1.7.

5. The method of claim 2 wherein:
at least some pads are uniformly spaced from one another along the periphery.

6. The method of claim 1 further comprising:
prior to said automatically placing, computing the plurality of values of the attribute in the design without the plurality of pads;
wherein the plurality of pads are placed around the periphery based on the plurality of values computed prior to said automatically placing.

7. The method of claim 1 wherein:
said first coordinate of the specific location is used to determine a corresponding first coordinate of the first pair of additional locations to be identical thereto; and
a second coordinate of the first pair of additional locations is determined based on corresponding second coordinates of the periphery.

8. A method of synthesizing pads for an integrated circuit device, the method being performed in a computer, the method comprising:
- automatically placing a plurality of pads around a periphery in a design of said integrated circuit device;
- automatically computing a plurality of values of an attribute at a corresponding plurality of locations in the design;
- automatically identifying a first location for having a value of the attribute satisfying a predetermined condition;
- automatically placing at least one additional pad at a peripheral location identified by a predetermined rule based on the first location; and
- storing in a memory of the computer, said plurality of pads and said at least one additional pad;
- wherein the first location is interior to said periphery; and
- wherein based on the first location the predetermined rule identifies a plurality of peripheral locations, including said peripheral location and checks if the first location has both coordinates within a predetermined distance from corresponding coordinates of a corner of the periphery, and if an outcome of checking is true the predetermined rule excludes from the plurality of peripheral locations being identified, one peripheral location from among a pair of peripheral locations having one coordinate within the predetermined distance from the corner.

9. The method of claim 1 wherein:
the first pair of additional locations are determined to be on the periphery adjacent to the specific location and having first coordinates at a common predetermined distance from the first coordinate of the specific location.

10. The method of claim 9 wherein:
the predetermined distance is three times width of a pad cell.

11. A memory comprising instructions to a computer to perform a method, the method comprising:
- placing a plurality of pads around a periphery in a design of an integrated circuit device;
- using the design and the plurality of pads, to compute a plurality of values of an attribute at a plurality of locations in the design;
- identifying a specific location among said plurality of locations for having a value of the attribute satisfying a predetermined condition, wherein said specific location is interior to said periphery; and
- placing at least one additional pad at an additional location on the periphery, said additional location being identified by a predetermined rule based on a coordinate of the specific location.

12. A computer comprising a processor and a memory coupled to the processor, the memory being encoded with instructions to synthesize pads for an integrated circuit device, wherein the instructions:
- automatically place a plurality of pads around a periphery in a design of said integrated circuit device;
- automatically use the design and the plurality of pads, to compute a plurality of values of an attribute at a corresponding plurality of locations in the design;
- automatically identify a specific location interior to the design, among the plurality of locations, for having a value of the attribute satisfying a predetermined condition;
- automatically place at least one additional pad at a peripheral location identified by a predetermined rule based on a coordinate of the specific location; and
- store in the memory, said plurality of pads and said at least one additional pad.

13. An apparatus for synthesizing pads for an integrated circuit device, the apparatus comprising:
- means for placing a plurality of pads around a periphery in a design of said integrated circuit device;
- means for using the design and the plurality of pads, to compute a plurality of values of an attribute at a corresponding plurality of locations in the design;
- means for identifying a specific location interior to the design, among the plurality of locations, for having a value of the attribute satisfying a predetermined condition;
- means for placing at least one additional pad at a peripheral location identified by a predetermined rule based on a coordinate of the specific location; and
- means for storing in a memory, said plurality of pads and said at least one additional pad.

14. A method of synthesizing pads for an integrated circuit device, the method being performed in a computer, the method comprising:

automatically computing a plurality of values of current through a plurality of pads in a design of the integrated circuit device;

automatically placing at least two additional pads along a periphery of the design, each additional pad being placed on each of two sides of a first location having a maximum current in said plurality of values;

automatically computing a plurality of values of voltage drop at a plurality of locations in the design;

automatically placing at least a second additional pad at a peripheral location, wherein at least one coordinate of the peripheral location is derived from a corresponding coordinate of a second location having a maximum voltage drop, and another coordinate of the peripheral location is at the periphery; and storing in a memory of the computer, said plurality of pads and at least one of said additional pads.

15. The method of claim 14 further comprising, prior to said automatically computing, and automatically placing:

automatically computing a plurality of values of an attribute in the design; and automatically placing the plurality of pads around the periphery based on the plurality of values.

16. The method of claim 1 wherein:

said automatically placing of the plurality of pads comprises temporarily placing a selected number of pads, computing a value of another attribute in the design, and if another predetermined condition is met by the value of said another attribute, doubling the selected number to obtain a new selected number and placing said new selected number of pads around the periphery.

17. The memory of claim 11 wherein the instructions to perform the method further comprise instructions to;

place another additional pad at another peripheral location identified by another predetermined rule, based on another coordinate of the specific location.

18. The memory of claim 11 wherein the instructions to perform the placing of the plurality of pads comprise instructions to:

temporarily place a selected number of pads, compute a value of another attribute in the design, and if another predetermined condition is met by the value of said another attribute, change the selected number of the plurality of pads placed to a new selected number and place said new selected number of pads around the periphery.

\* \* \* \* \*

UNITED STATES PATENT AND TRADEMARK OFFICE
CERTIFICATE OF CORRECTION

PATENT NO. : 7,536,658 B2  Page 1 of 1
APPLICATION NO. : 10/976719
DATED : May 19, 2009
INVENTOR(S) : Sung-Hoon Kwon It is certified that error appears in the above-identified patent and that said Letters Patent is hereby corrected as shown below:

Column 18
Line 10, "to;" should be replaced with --to:--.

Signed and Sealed this

Eighth Day of September, 2009

David J. Kappos
*Director of the United States Patent and Trademark Office*